United States Patent
Che et al.

(10) Patent No.: US 9,627,468 B2
(45) Date of Patent: Apr. 18, 2017

(54) CAPACITOR STRUCTURE AND METHOD OF MANUFACTURING THE SAME

(71) Applicant: Powerchip Technology Corporation, Hsinchu (TW)

(72) Inventors: Shyng-Yeuan Che, Hsinchu County (TW); Hsin-Lan Hsueh, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 7 days.

(21) Appl. No.: 14/826,210

(22) Filed: Aug. 14, 2015

(65) Prior Publication Data
US 2016/0351656 A1  Dec. 1, 2016

(30) Foreign Application Priority Data
May 29, 2015  (TW) .............................. 104117462 A

(51) Int. Cl.
*H01L 21/321* (2006.01)
*H01L 49/02* (2006.01)
(Continued)

(52) U.S. Cl.
CPC ........ *H01L 28/82* (2013.01); *H01L 21/28568* (2013.01); *H01L 21/31144* (2013.01);
(Continued)

(58) Field of Classification Search
CPC ............... H01L 28/82; H01L 21/32139; H01L 21/28568; H01L 23/5226; H01L 21/32115;
(Continued)

(56) References Cited

U.S. PATENT DOCUMENTS

| 7,638,830 B2 | 12/2009 | Hsin et al. | |
| 2006/0118907 A1* | 6/2006 | Park | H01L 23/5223 257/532 |
| 2014/0217549 A1* | 8/2014 | Tzeng | H01L 23/147 257/532 |

FOREIGN PATENT DOCUMENTS

| TW | 353792 | 3/1999 |
| TW | I236102 | 7/2005 |
| TW | I313945 | 8/2009 |

OTHER PUBLICATIONS

"Office Action of Taiwan Counterpart Application", issued on Oct. 26, 2016, p. 1-p. 7.

* cited by examiner

*Primary Examiner* — Selim Ahmed
(74) *Attorney, Agent, or Firm* — Jianq Chyun IP Office

(57) ABSTRACT

Provided is a capacitor structure including a substrate, a dielectric layer, a first conductive layer, and a cup-shaped capacitor. The dielectric layer is located on the substrate. The first conductive layer is located in the dielectric layer. The cup-shaped capacitor penetrates through the first conductive layer and is located in the dielectric layer. The cup-shaped capacitor includes a bottom electrode, a capacitor dielectric layer, and a top electrode. Two sidewalls of the bottom electrode are electrically connected to the first conductive layer. The capacitor dielectric layer covers a surface of the bottom electrode. The top electrode covers a surface of the capacitor dielectric layer. The capacitor dielectric layer is located between the top electrode and the bottom electrode. A top surface of the bottom electrode is lower than a top surface of the top electrode. Also the invention provides a method of manufacturing the capacitor structure.

19 Claims, 10 Drawing Sheets

(51) Int. Cl.
  *H01L 21/768* (2006.01)
  *H01L 21/285* (2006.01)
  *H01L 21/3213* (2006.01)
  *H01L 21/311* (2006.01)
  *H01L 23/522* (2006.01)

(52) U.S. Cl.
  CPC .. *H01L 21/32115* (2013.01); *H01L 21/32139* (2013.01); *H01L 21/76802* (2013.01); *H01L 21/76877* (2013.01); *H01L 23/5223* (2013.01)

(58) Field of Classification Search
  CPC ......... H01L 21/76877; H01L 21/31144; H01L 21/76802
  USPC .......................................................... 257/532
  See application file for complete search history.

CAPACITOR STRUCTURE AND METHOD OF MANUFACTURING THE SAME

CROSS-REFERENCE TO RELATED APPLICATION

This application claims the priority benefit of Taiwan application serial no. 104117462, filed on May 29, 2015. The entirety of the above-mentioned patent application is hereby incorporated by reference herein and made a part of this specification.

BACKGROUND OF THE INVENTION

1. Field of the Invention

The invention relates to a semiconductor device and a method of manufacturing the same, and particularly relates to a capacitor structure and a method of manufacturing the same.

2. Description of Related Art

In the semiconductor industry nowadays, the capacitor is a very important fundamental component. For example, the metal-insulator-metal capacitor (MIM capacitor) is a common capacitor structure, and the basic design thereof is to fill a dielectric material between metal plates that serve as electrodes, such that the adjacent metal plates and the dielectric material therebetween may form a capacitor unit.

However, as semiconductor devices are miniaturized, the usable area for the MIM capacitors decreases, making the capacitance density decreases as well. Thus, the function of the semiconductor devices is affected. Therefore, how to improve the capacitor structure to increase the capacitance density under the setting of the current manufacturing processes has become an important issue to work on.

SUMMARY OF THE INVENTION

The invention provides a capacitor structure and a method of manufacturing the same capable of increasing a capacitance area to increase a capacitance density.

The invention provides a capacitor structure, including a substrate, a dielectric layer, a first conductive layer, and a cup-shaped capacitor. The dielectric layer is located on the substrate. The first conductive layer is located in the dielectric layer. The cup-shaped capacitor penetrates through the first conductive layer and is located in the dielectric layer. The cup-shaped capacitor includes a bottom electrode, a capacitor dielectric layer, and a top electrode. Two sidewalls of the bottom electrode are electrically connected to the first conductive layer. The capacitor dielectric layer covers a surface of the bottom electrode. The top electrode covers a surface of the capacitor dielectric layer. The capacitor dielectric layer is disposed between the top electrode and the bottom electrode. A top surface of the bottom electrode is lower than a top surface of the top electrode.

According to an embodiment of the invention, a distance is kept between the top surface of the bottom electrode and the top surface of the top electrode. The distance is in a range from 0.01 μm to 2000 μm.

According to an embodiment of the invention, the capacitor structure further includes a plurality of vias disposed in the dielectric layer at a side of the cup-shaped capacitor. One of the vias is electrically connected to the bottom electrode through the first conductive layer.

According to an embodiment of the invention, the capacitor structure further includes a second conductive layer disposed on the cup-shaped capacitor. The second conductive layer is electrically connected to the top electrode.

According to an embodiment of the invention, the capacitor structure further includes a plug disposed between the top electrode and the second conductive layer. The top electrode surrounds the plug, and the plug is electrically connected to the second conductive layer.

According to an embodiment of the invention, the capacitor dielectric layer further extends to a top surface of the dielectric layer, and the capacitor dielectric layer is disposed between the second conductive layer and the dielectric layer.

According to an embodiment of the invention, the capacitor structure further includes a blocking layer disposed below the cup-shaped capacitor.

According to an embodiment of the invention, materials of the bottom electrode and the top electrode include titanium nitride (TiN), tantalum nitride (TaN), tungsten (W), titanium tungsten (TiW), aluminum (Al), copper (Cu), or a combination thereof.

According to an embodiment of the invention, a material of the capacitor dielectric layer includes low-temperature oxide (LTO), nitride, or a combination thereof.

The invention provides a method of manufacturing a capacitor structure, including steps as follows. A dielectric layer is formed on a substrate. A first conductive layer is formed in the dielectric layer. A cup-shaped capacitor is formed in the dielectric layer. The cup-shaped capacitor penetrates through the first conductive layer. The cup-shaped capacitor includes a bottom electrode, a capacitor dielectric layer, and a top electrode. Two sidewalls of the bottom electrode are electrically connected to the first conductive layer. The capacitor dielectric layer covers a surface of the bottom electrode. The top electrode covers a surface of the capacitor dielectric layer. The capacitor dielectric layer is disposed between the top electrode and the bottom electrode. A top surface of the bottom electrode is lower than a top surface of the top electrode.

According to an embodiment of the invention, after forming the cup-shaped capacitor in the dielectric layer, a second conductive layer is formed on the cup-shaped capacitor. The second conductive layer is electrically connected to the top electrode.

According to an embodiment of the invention, the step of forming the cup-shaped capacitor in the dielectric layer includes the following. A first opening is formed in the dielectric layer. The first opening penetrates through the first conductive layer. A bottom electrode material layer is formed in the first opening. A photoresist layer is formed on the dielectric layer. The photoresist layer is filled into the first opening and covers a surface of the bottom electrode material layer. A portion of the photoresist layer and a portion of the bottom electrode material layer are removed, so as to expose a portion of a sidewall of the first opening. Also, the bottom electrode is formed in the first opening. The photoresist layer is removed. A capacitor dielectric material layer is formed on the dielectric layer. The capacitor dielectric material layer at least covers the surface of the bottom electrode and a portion of the sidewall of the first opening. A top electrode material layer is formed on the dielectric layer. The top electrode material layer covers a surface of the capacitor dielectric material layer. A planarization process is performed to remove the top electrode material layer on a top surface of the dielectric layer.

According to an embodiment of the invention, after forming the capacitor dielectric material layer on the dielectric layer, a plurality of via openings are formed in the dielectric layer at a side of the cup-shaped capacitor.

According to an embodiment of the invention, in the step of forming the top electrode material layer on the dielectric layer, the top electrode material layer further extends to cover surfaces of the via openings.

According to an embodiment of the invention, after forming the cup-shaped capacitor in the dielectric layer, a conductive material layer is formed on the dielectric layer. The conductive material layer is filled into the first opening to form a plug. The conductive material layer is filled into the via openings to form a plurality of vias. One of the vias is electrically connected to the bottom electrode through the first conductive layer.

According to an embodiment of the invention, a material of the conductive material layer includes titanium nitride, tantalum nitride, tungsten, titanium tungsten, aluminum, copper, or a combination thereof.

According to an embodiment of the invention, the step of forming the first opening in the dielectric layer includes the following. A patterned mask layer is formed on the dielectric layer. Using the first conductive layer as an etch stop layer, a first etching process is performed to remove a portion of the dielectric layer. A second etching process is performed to remove a portion of the first conductive layer, so as to penetrate through the first conductive layer.

According to an embodiment of the invention, before forming the first conductive layer in the dielectric layer, a blocking layer is formed below the cup-shaped capacitor.

According to an embodiment of the invention, the step of forming the first opening in the dielectric layer includes the following. A patterned mask layer is formed on the dielectric layer. Using the blocking layer as an etch stop layer, a third etching process is performed to remove a portion of the dielectric layer. The first conductive layer has at least one second opening. The second opening corresponds to the first opening.

According to an embodiment of the invention, the planarization process includes a chemical mechanical polishing (CMP) process.

Based on above, in the invention, a metal-insulator-metal (MIM) capacitor is manufactured by using an inter-metal process in the original semiconductor manufacturing processes. Therefore, an additional MIM manufacturing process is not required. Specifically, in the MIM capacitor, the capacitor dielectric layer is formed between two metal layers, and the top electrode and the bottom electrode are formed by performing a via process. Accordingly, the invention is applicable to the conventional semiconductor structure and does not require additional manufacturing process and cost. Besides, in the invention, the MIM capacitor may be formed between two or more inter-metal layers. Therefore, a chip area may be effectively used and a capacitance area may also be increased to enhance a capacitance density.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
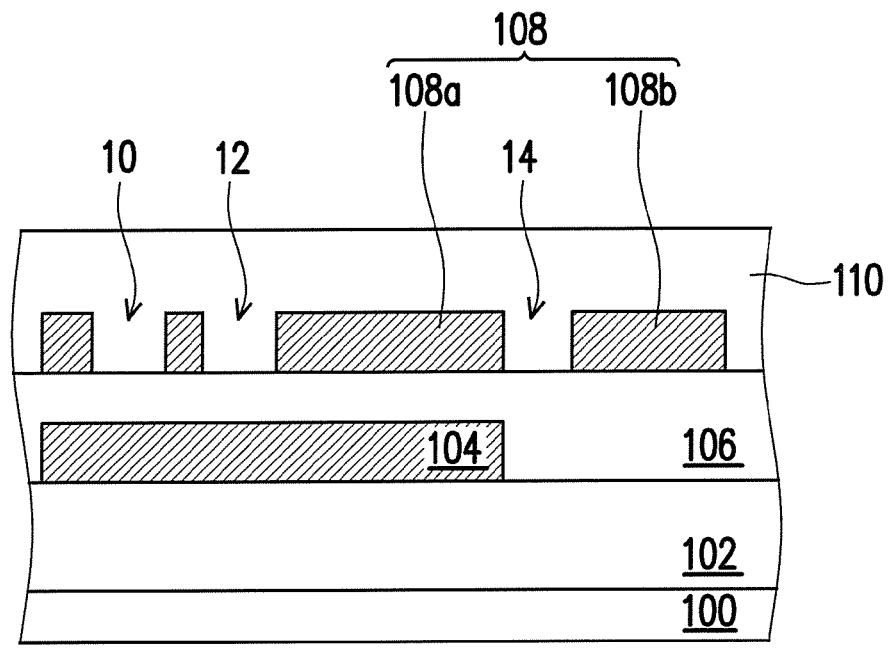
FIGS. 1A to 1J are cross-sectional schematic views illustrating a method of manufacturing a capacitor structure according to a first embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1J are cross-sectional schematic views illustrating a method of manufacturing a capacitor structure according to a first embodiment of the invention.

Referring to FIG. 1A, first of all, a dielectric layer 102 is formed on a substrate 100. There is no specific limitation on the substrate 100. For example, the substrate 100 may be any semiconductor substrate, or may be a substrate having other layers disposed thereon. A material of the dielectric layer 102 is a low-k material or silicon oxide, for example. The low-k material is SiOC, for example. A method of forming the dielectric layer 102 includes performing a chemical vapor deposition process, for example.

Then, a blocking layer 104 is formed on the dielectric layer 102. The blocking layer 104 may serve as an etch stop layer in a subsequent etching process, such that an opening 20b and an opening 22b formed subsequently have the same depth (as shown in FIG. 1D). A material of the blocking layer 104 may be titanium nitride, tantalum nitride, tungsten, titanium tungsten, aluminum, copper, or a combination thereof, for example. A method of forming the blocking layer 104 includes performing a physical vapor deposition process or a chemical vapor deposition process, for example.

Then, a dielectric layer 106 is formed on the blocking layer 104. The dielectric layer 106 covers the blocking layer 104 and the dielectric layer 102. A material of the dielectric layer 106 and a method of forming the dielectric layer 106 are similar to those of the dielectric layer 102. Therefore, details in these respects will not be reiterated in the following.

Then, a conductive layer 108 is formed on the dielectric layer 106. The conductive layer 108 has a plurality of openings 10, 12, and 14. The openings 10, 12, and 14 expose a top surface of the dielectric layer 106. The openings 10 and 12 may be adapted to define positions of a capacitor 130 (as shown in FIG. 1J), so as to reduce manufacturing processes of forming openings 20b and 22b subsequently (as shown in FIG. 1D). The opening 14 is adapted to electrically isolate conductive layers 108a and 108b. A material of the conductive layer 108 may be titanium nitride, tantalum nitride, tungsten, titanium tungsten, aluminum, copper, or a combination thereof, for example. A method of forming the conductive material layer 108 includes performing a physical vapor deposition process or a chemical vapor deposition process, for example. In an embodiment, the material of the blocking layer 104 and the material of the conductive layer 108 may be the same or different.

Then, a dielectric layer 110 is formed on the conductive layer 108. The dielectric layer 110 covers the conductive layer 108 and is filled into the openings 10, 12, and 14. A material of the dielectric layer 110 and a method of forming the dielectric layer 110 are similar to those of the dielectric layer 102. Therefore, details in these respects will not be reiterated in the following.

Figure 1B:
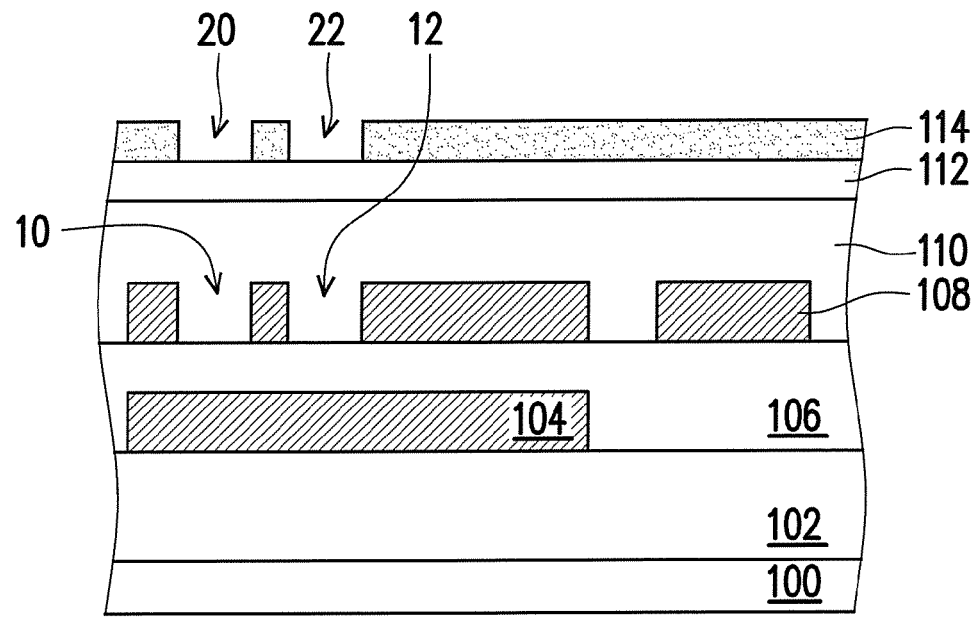

Referring to FIG. 1B, a hardmask layer 112 and a patterned photoresist layer 114 are sequentially formed on the dielectric layer 110. The patterned photoresist layer 114 has openings 20 and 22. The opening 20 corresponds to the opening 10, and the opening 22 corresponds to the opening 12. A material of the hardmask layer 112 may be a silicon material, a metal material, a carbon material, or a combination thereof, for example. The silicon material may be silicon nitride, silicon oxynitride, silicon oxide, or a combination thereof, for example. A material of the patterned photoresist layer 114 may be a positive photoresist material or a negative photoresist material, for example.

Figure 1C:
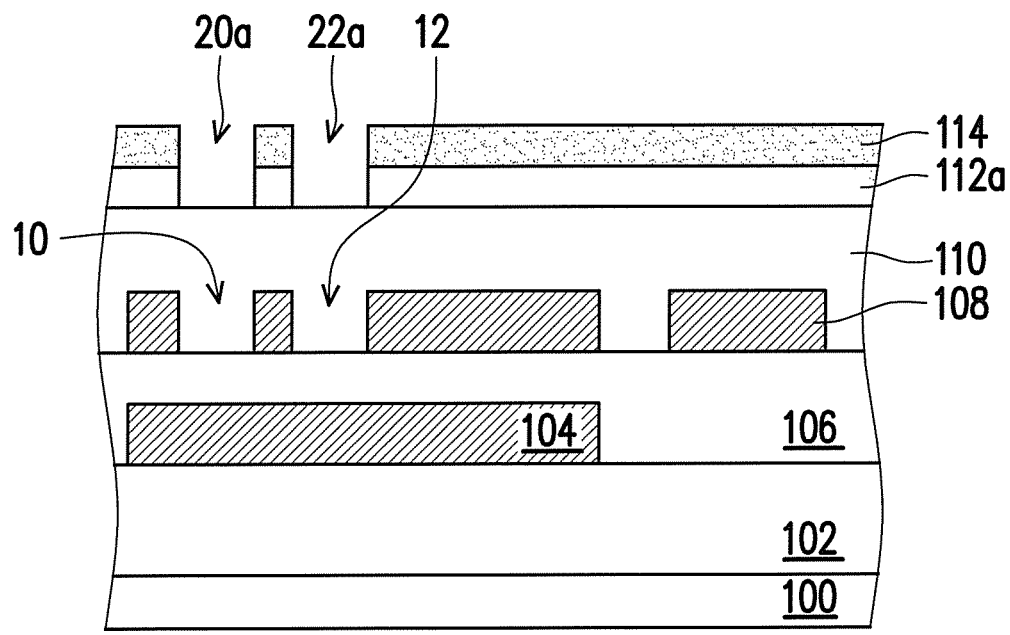
Figure 1D:
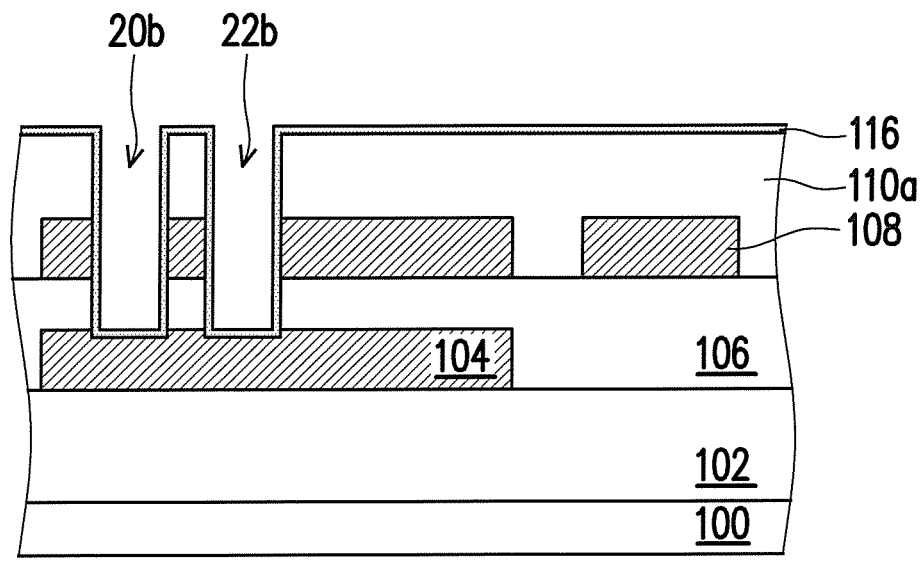

Referring to FIG. 1C, using the patterned photoresist layer 114 as a mask, a portion of the hardmask layer 112 is removed to form openings 20a and 22a. The openings 20a and 22a expose a top surface of the dielectric layer 110.

Referring to FIGS. 1C and 1D, using the blocking layer 104 as an etch stop layer, an etching process is performed to form the openings 20b and 22b. The openings 20b and 22b expose a top surface of the blocking layer 104 and penetrate through the conductive layer 108. In this embodiment, the etching process removes a portion of the dielectric layer 110 and a portion of the dielectric layer 106, for example. Since the conductive layer 108 already defines the openings 10 and 12, in this embodiment, the etching process may be performed by simply introducing an etching gas (i.e., an etching gas that removes the dielectric layers 106 and 110). Accordingly, the manufacturing processes of this embodiment may be reduced, so as to save a manufacturing cost. In an embodiment, the etching process may be an anisotropic etching process, for example. Then, the patterned photoresist layer 114 and a hardmask layer 112a are removed. Next, a bottom electrode material layer 116 is formed on a dielectric layer 110a. More specifically, the bottom electrode material layer 116 is conformally formed in the openings 20b and 22b. In an embodiment, the bottom material layer 116 may be formed of titanium nitride, tantalum nitride, tungsten, titanium tungsten, aluminum, copper, or a combination thereof, for example. The requirement is met as long as the material of the bottom electrode material layer 116 is a conductive material having a high step coverage. The invention is not limited to the aforesaid materials. A method of forming the bottom electrode material layer 116 includes performing a physical vapor deposition process or a chemical vapor deposition process, for example.

Figure 1E:
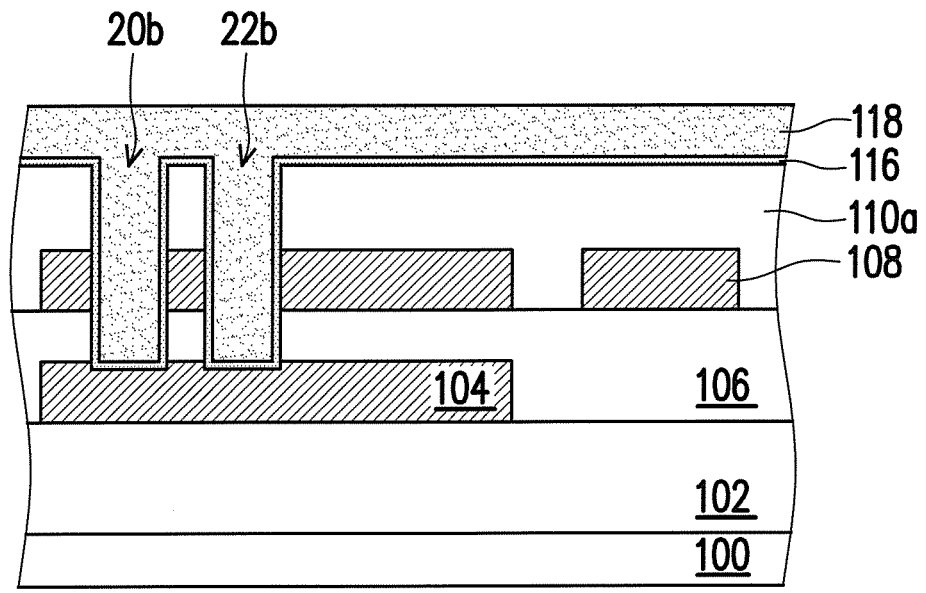

Referring to FIG. 1E, a photoresist layer 118 is formed on the dielectric layer 110a. The photoresist layer 118 is filled into the openings 20b and 22b, and covers a surface of the bottom electrode material layer 116. A material of the photoresist layer 118 may be a positive photoresist material or a negative photoresist material, for example.

Figure 1F:
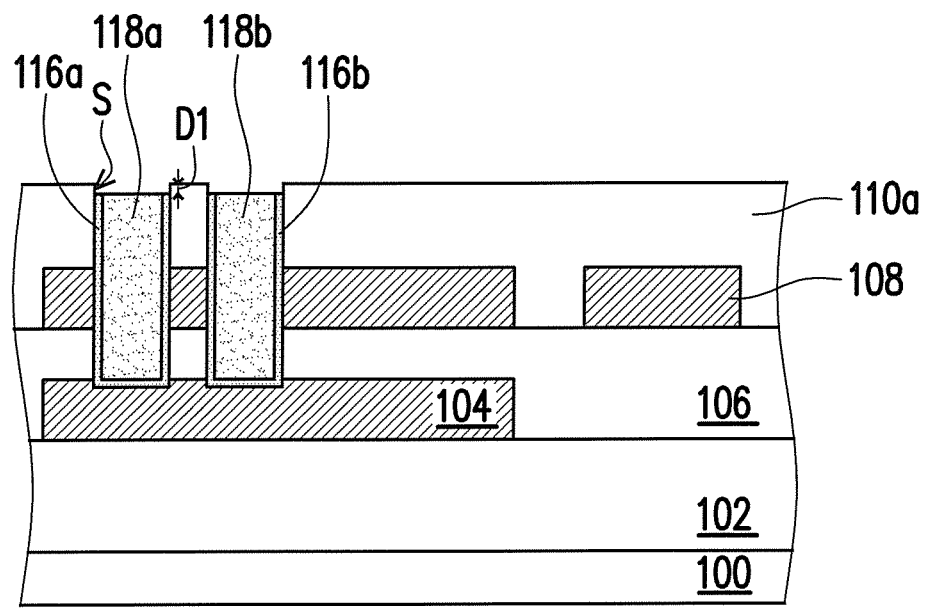

Referring to FIGS. 1E and 1F, a portion of the photoresist layer 118 and a portion of the bottom electrode material layer 116 are removed to expose a portion of sidewalls S of the openings 20b and 22b. More specifically, an exposure process and a development process are firstly performed to remove the photoresist layer 118 on a top surface of the dielectric layer 110a. Then, the bottom electrode material layer 116 on the top surface of the dielectric layer 110a is removed, so as to form a bottom electrode 116a in the opening 20b and a bottom electrode 116b in the opening 22b. Since a portion of the sidewalls S of the openings 20b and 22b is exposed, a distance D1 (i.e., a height of the portion of the sidewalls S) is kept between a top surface of the bottom electrode 116a and the top surface of the dielectric layer 110a. In an embodiment, the distance D1 may be in a range from 0.01 μm to 2000 μm. In addition, since the bottom electrode 116a is formed along the opening 20b, the bottom electrode 116a may be a cup-shaped structure, for example. Similarly, the bottom electrode 116b may also be a cup-shaped structure, for example.

Figure 1G:
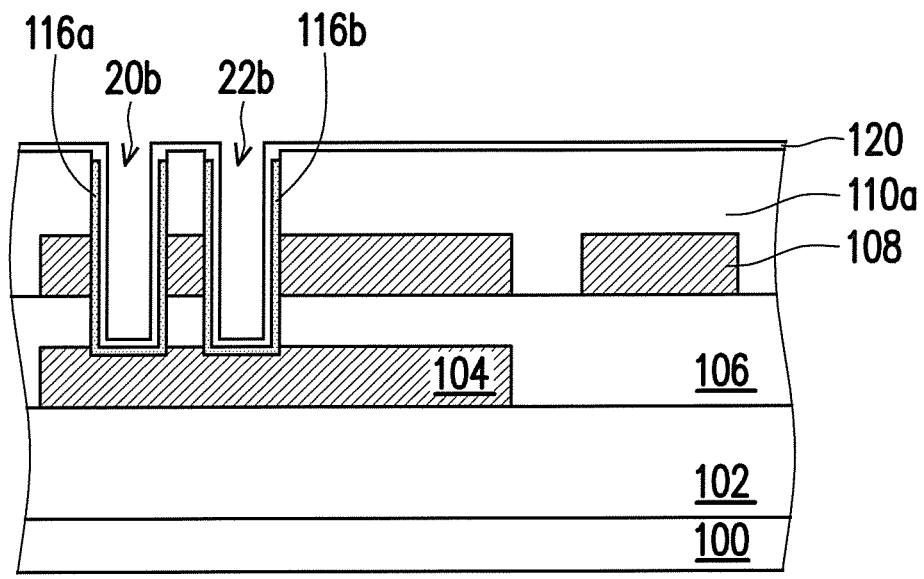

Referring to FIGS. 1F and 1G, photoresist layers 118a and 118b are removed. Then, a capacitor dielectric material layer 120 is formed on the dielectric layer 110a. The capacitor dielectric material layer 120 covers surfaces and top surfaces of the bottom electrodes 116a and 116b, a portion of the sidewalls S of the openings 20b and 22b, and the top surface of the dielectric layer 110a. In an embodiment, a material of the capacitor dielectric material layer 120 may be low-temperature oxide (LTO), for example. In general, the requirement is met as long as a forming temperature of the capacitor dielectric material layer 120 is lower than a forming temperature of an inter-metal layer in a semiconductor manufacturing process. The invention does not intend to limit the material of the capacitor dielectric material layer 120. A thickness of the capacitor dielectric material layer 120 may be in a range from 2 nm to 2000 nm.

Figure 1H:
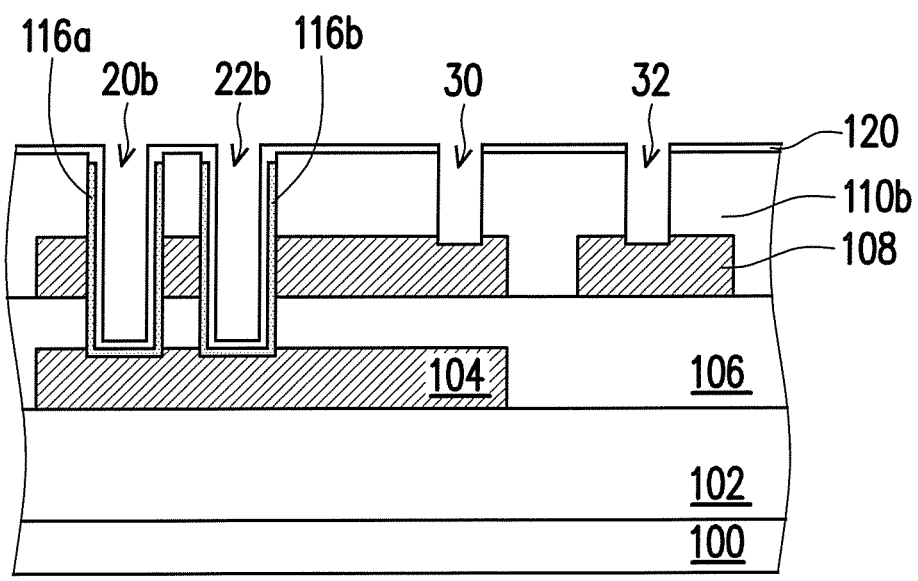
Figure 1I:
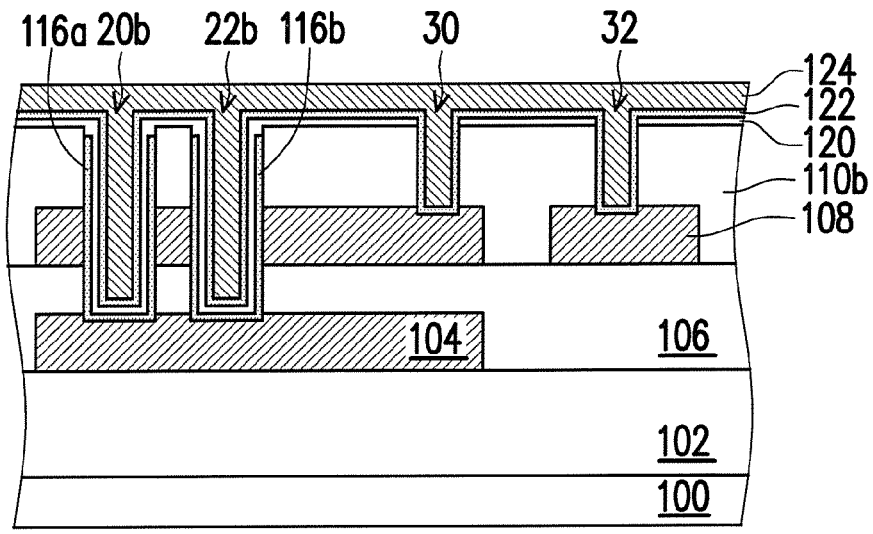
Figure 1J:
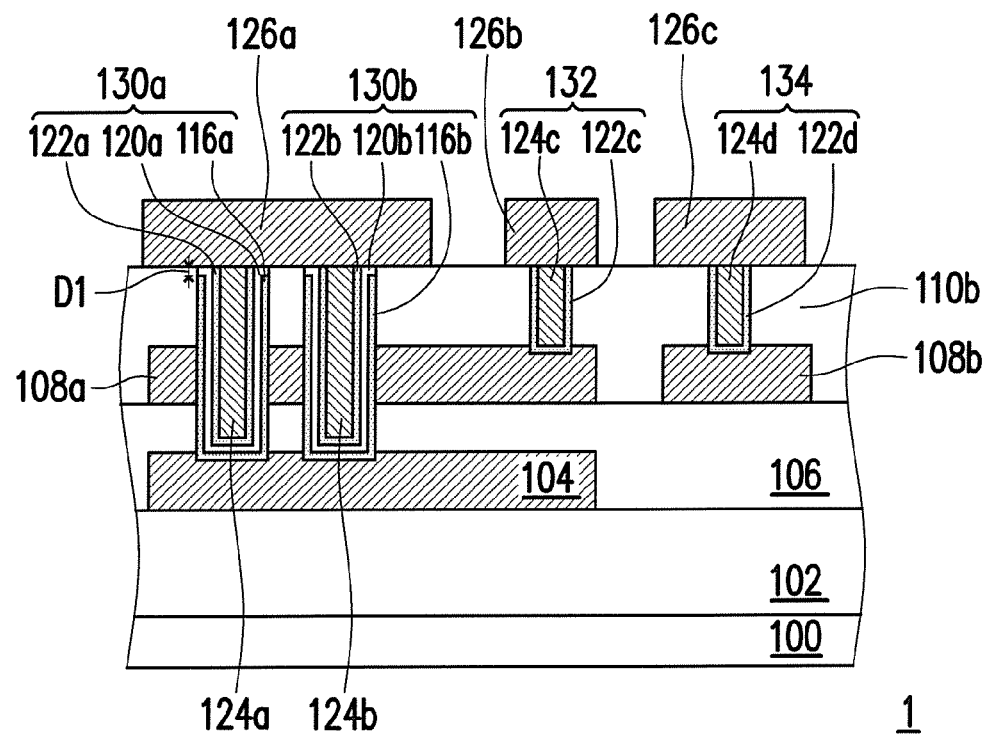

Referring to FIGS. 1H and 1I, a plurality of via openings 30 and 32 are formed in a dielectric layer 110b at a side of the openings 20b and 22b. Then, a top electrode material layer 122 is formed on the dielectric layer 110b. More specifically, the top electrode material layer 122 covers a surface of the capacitor dielectric material layer 120, and is conformally formed in the openings 20b and 22b and the via openings 30 and 32. Then, a conductive material layer 124 is formed on the dielectric layer 110b. The conductive material layer 124 is filled into the openings 20b and 22b, so as to respectively form plugs 124a and 124b. The conductive material layer 124 is filled into the via openings 30 and 32, so as to respectively form vias 132 and 134 (as shown in FIG. 1J). In an embodiment, materials of the top electrode material layer 122 and the conductive material layer 124 may be titanium nitride, tantalum nitride, tungsten, titanium tungsten, aluminum, copper, or a combination thereof, for example. As above, the requirement is met as long as the material of the top electrode material layer 122 is a conductive material layer having a high step coverage. The invention is not limited to the aforesaid materials. Methods of forming the top electrode material layer 122 and the conductive material layer 124 include performing a physical vapor deposition process or a chemical vapor deposition process, for example. In an embodiment, the material of the top electrode material layer 122 and the material of the conductive material layer 124 may be the same or different.

Referring to FIGS. 1I and 1J, a planarization process is performed to remove the conductive material layer 124, the top electrode material layer 122, and the capacitor dielectric material layer 120 on a top surface of the dielectric layer 110b, so as to expose the top surface of the dielectric layer 110b. Then, conductive layers 126a, 126b, and 126c are formed on the dielectric layer 110b. The conductive layer 126a is electrically connected to cup-shaped capacitors 130a and 130b. The conductive layer 126b is electrically connected to the via 132. The conductive layer 126c is electrically connected to the via 134. In an embodiment, the planarization process may be a chemical mechanical polishing process, for example.

Referring to FIG. 1J, a capacitor structure 1 according to the first embodiment of the invention includes the substrate 100, the dielectric layers 102, 106, and 110b, the blocking layer 104, the conductive layers 108a and 108b, and the cup-shaped capacitors 130a and 130b. The dielectric layers 102, 106, and 110b are located on the substrate 100. The conductive layers 108a and 108b are located in the dielectric layer 110b. The cup-shaped capacitors 130a and 130b respectively penetrate through the conductive layer 108a and are located in the dielectric layer 110b. The blocking layer 104 is below the cup-shaped capacitors 130a and 130b. However, the invention is not limited thereto. In other embodiments, the capacitor structure 1 may not include the blocking layer 104. More specifically, the cup-shaped capacitor 130a includes the bottom electrode 116a, the capacitor dielectric layer 120a, and the top electrode 122a. The bottom electrode 116a may be in a cup-shaped structure, for example, and two sidewalls of the bottom electrode 116a are electrically connected to the conductive layer 108a. Therefore, the conductive layer 108a may be considered as a conductive line that electrically connects the bottom electrode 116a to external connections. The capacitor dielectric layer 120a covers the surface and the top surface of the bottom electrode 116a. The top electrode 122a covers the surface of the capacitor dielectric layer 120a. In other words, the capacitor dielectric layer 120a is disposed between the top electrode 122a and the bottom electrode 116a. It should be noted that since the top surface of the bottom electrode 116a is lower than a top surface of the top electrode 122a, and a portion of the capacitor dielectric layer 120a is located between the bottom electrode 116a and the top electrode 122a, the bottom electrode 116a and the top electrode 122a are electrically isolated from each other. The distance D1 is kept between the top surface of the bottom electrode 116a and the top surface of the dielectric layer 110a. In an embodiment, the distance D1 may be in a range from 0.01 μm to 2000 μm. Similarly, a shape and connection relations of the cup-shaped capacitor 130b are similar to those of the cup-shaped capacitor 130a. Thus, details in these respects will not be reiterated in the following. While FIG. 1J illustrates two cup-shaped capacitors 130a and 130b, the invention is not limited thereto. In other embodiment, the number of the cup-shaped capacitors may be one or more.

Besides, the capacitor structure 1 further includes the conductive layers 126a, 126b, and 126c, the plugs 124a and 124b, and the vias 132 and 134. The vias 132 and 134 are disposed in the dielectric layer 110a at a side of the cup-shaped capacitors 130a and 130b. The dielectric layer 132 includes a barrier layer 122c and the plug 124c, and the barrier layer 122c surrounds the plug 124c. Similarly, the via 134 includes a barrier layer 122d and the plug 124d, and the barrier layer 122d surrounds the plug 124d. The via 132 may be electrically connected to the bottom electrode 116a through the conductive layer 108a. More specifically, the conductive layer 126b is disposed above the via 132, and may be electrically connected to the bottom electrode 116a through the via 132 and the conductive layer 108a. The conductive layer 126c is disposed above the via 134, and may be electrically connected to the conductive layer 108b through the via 134. Also, the conductive layer 126a is disposed above the cup-shaped capacitors 130a and 130b. The plug 124a is disposed between the top electrode 122a and the conductive layer 126a. The top electrode 122a surrounds the plug 124a, and the top electrode 122a and the plug 124a are electrically connected to the conductive layer 126a. Similarly, the plug 124b is disposed between the top electrode 122b and the conductive layer 126a. The top electrode 122b surrounds the plug 124b, and the top electrode 122b and the plug 124b are electrically connected to the conductive layer 126a. Besides, in FIG. 1J, even though the cup-shaped capacitors 130a and 130b are disposed between the blocking layer 104 and the conductive layer 126a, the invention is not limited thereto. In other embodiments, the cup-shaped capacitor may be disposed between inter-metal layers. For example, the cup-shaped capacitor may be disposed between a first metal layer (M1) and a top metal layer (TM), or between the first metal layer (M1) and a third metal layer (M3).

Figure 2A:
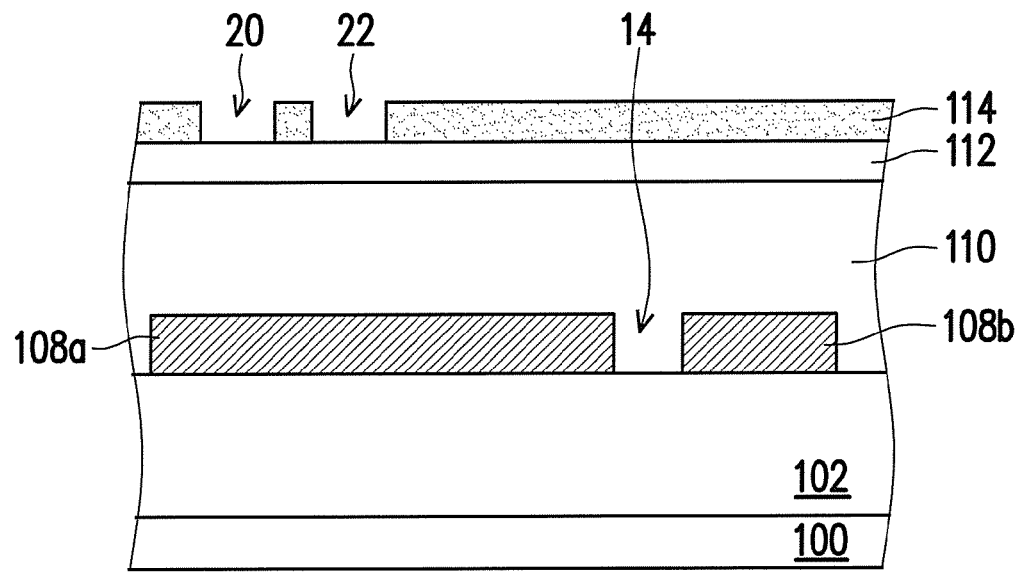
FIGS. 2A to 2J are cross-sectional schematic views illustrating a method of manufacturing a capacitor structure according to a second embodiment of the invention.

In the following embodiment, like or similar devices, components and layers are referred to by like or similar reference symbols. For example, the dielectric layer 102 of FIG. 1A and the dielectric layer 102 in FIG. 2A are like or similar components. Materials and forming methods of the like and similar components will thus not be reiterated in the following.

FIGS. 2A to 2J are cross-sectional schematic views illustrating a method of manufacturing a capacitor structure according to a second embodiment of the invention.

Referring to FIG. 2A, the dielectric layer 102, the conductive layers 108a and 108b, the dielectric layer 110, the hardmask layer 112, and the patterned photoresist layer 114 are sequentially formed. The patterned photoresist layer 114 has the openings 20 and 22. The openings 20 and 22 are disposed above the conductive layer 108a.

Figure 2B:
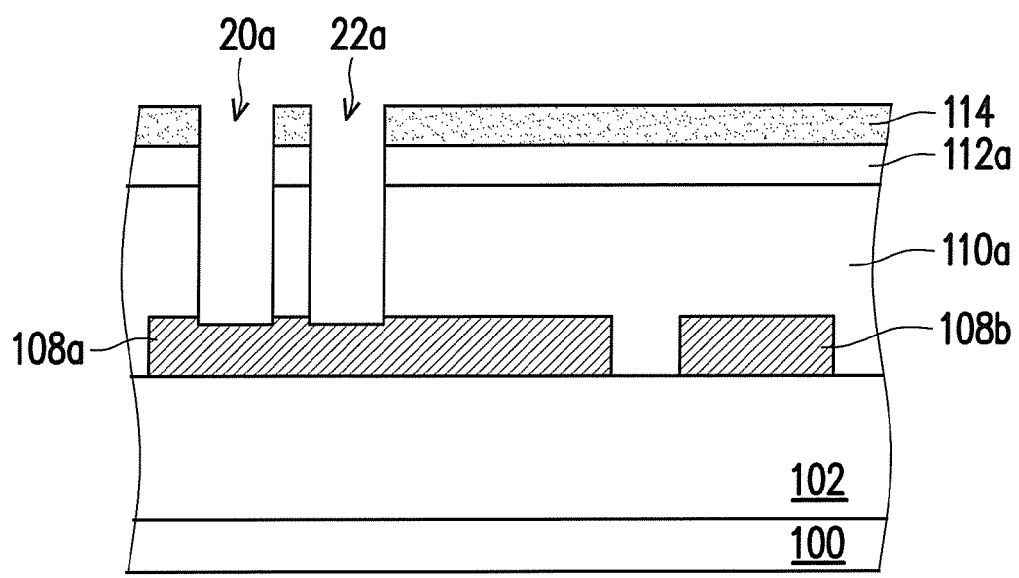

Referring to FIG. 2B, using the conductive layer 108a as an etch stop layer, a first etching process is performed to remove a portion of the hardmask layer 112 and a portion of the dielectric layer 110 to form the openings 20a and 22a. The openings 20a and 22a expose a top surface of the conductive layer 108a.

Figure 2C:
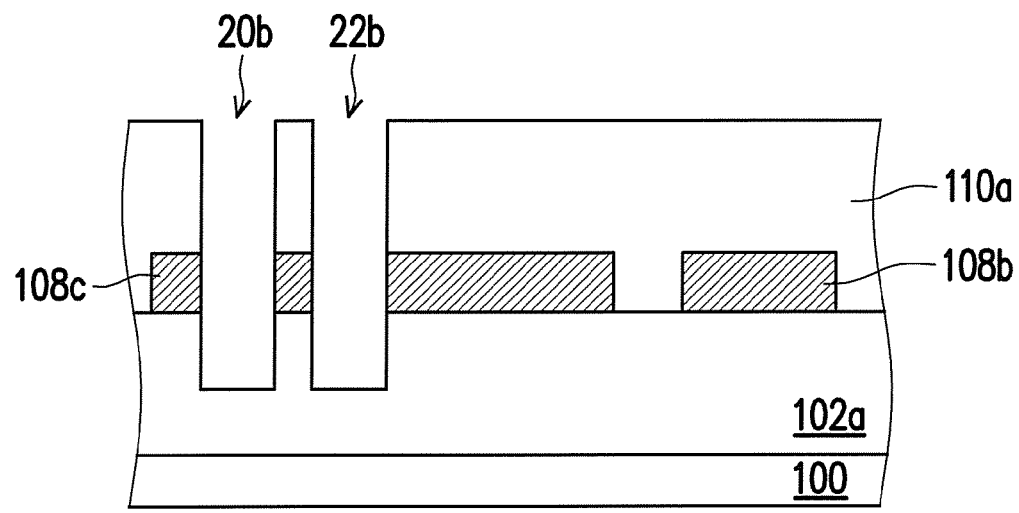

Then, referring to FIG. 2C, a second etching process is performed to remove a portion of the conductive layer 108a and a portion of the dielectric layer 102 to form the openings 20b and 22b. The openings 20b and 22b penetrate through the conductive layer 108a to expose a portion of a surface of the dielectric layer 102a. In an embodiment, depths of the openings 20b and 22b may be adjusted according to requirements of the manufacturing processes, and the invention is not limited to the above.

Figure 2D:
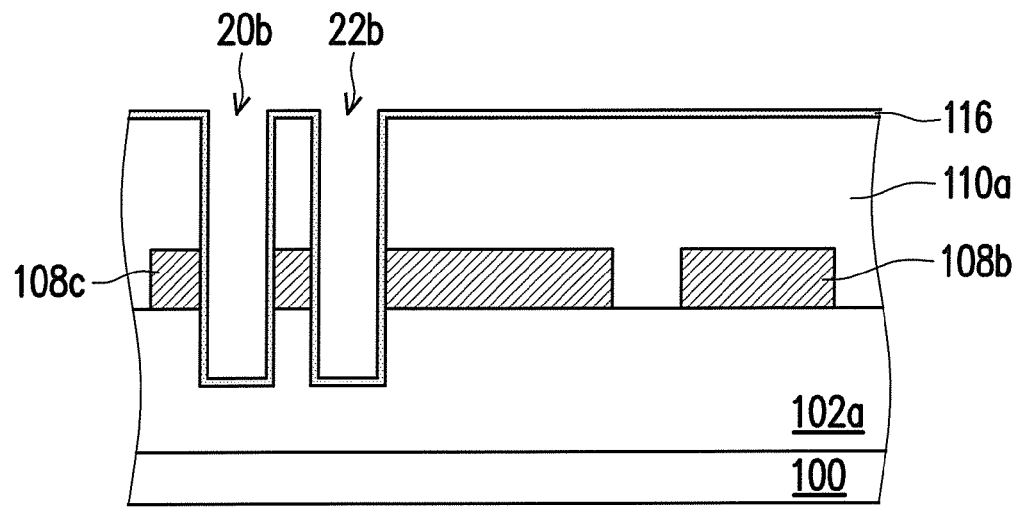
Figure 2E:
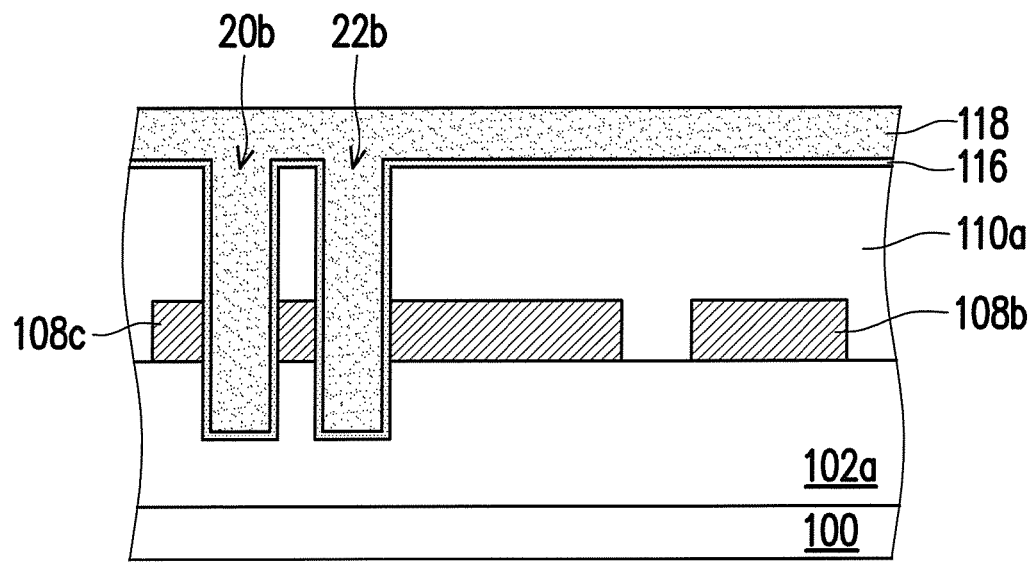

Referring to FIGS. 2D and 2E, the bottom electrode material layer 116 is formed on the dielectric layer 110a. More specifically, the bottom electrode material layer 116 is conformally formed in the openings 20b and 22b. Then, the photoresist layer 118 is formed on the dielectric layer 110a. The photoresist layer 118 is filled into the openings 20b and 22b, and covers the surface of the bottom electrode material layer 116.

Figure 2F:
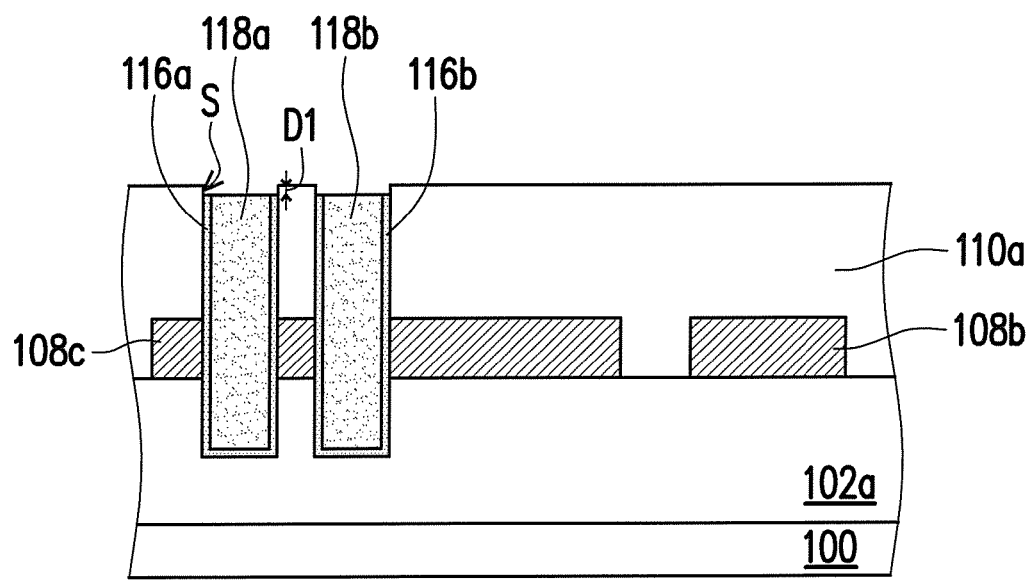

Referring to FIGS. 2E and 2F, a portion of the photoresist layer 118 and a portion of the bottom electrode material layer 116 are removed to expose a portion of the sidewalls S of the openings 20b and 22b. The distance D1 (i.e., the height of the portion of the sidewalls S) is kept between the top surface of the bottom electrode 116a and the top surface of the dielectric layer 110a. In an embodiment, the distance D1 may be in a range from 0.01 μm to 2000 μm. Besides, the bottom electrodes 116a and 116b may be cup-shaped structures, for example.

Figure 2G:
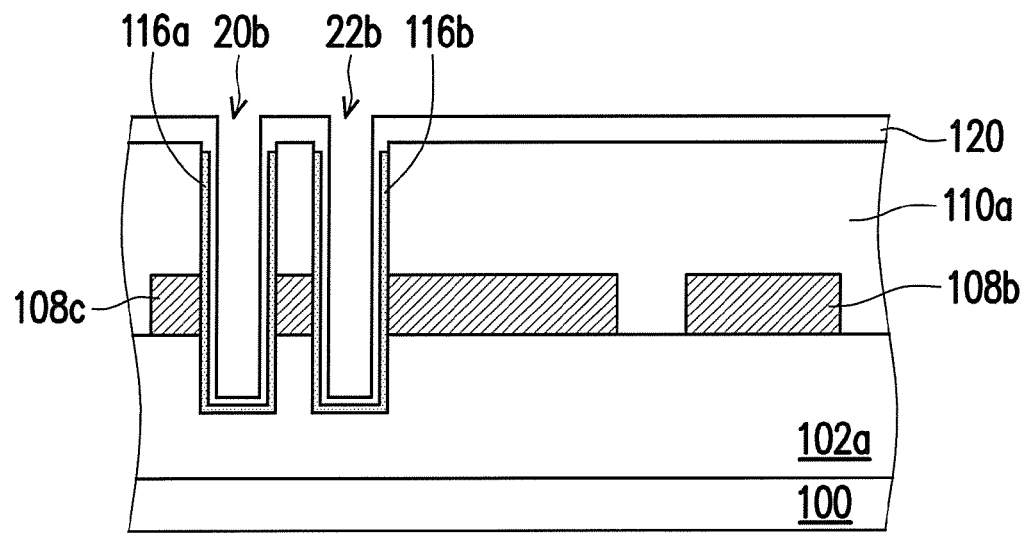

Referring to FIGS. 2F and 2G, the photoresist layers 118a and 118b are removed. Then, the capacitor dielectric material layer 120 is formed on the dielectric layer 110a. The capacitor dielectric material layer 120 covers the surfaces and top surfaces of the bottom electrodes 116a and 116b, a portion of the sidewalls S of the openings 20b and 22b, and the top surface of the dielectric layer 110a. In an embodiment, the thickness of the capacitor dielectric material layer 120 may be in a range from 2 nm to 2000 nm.

Figure 2H:
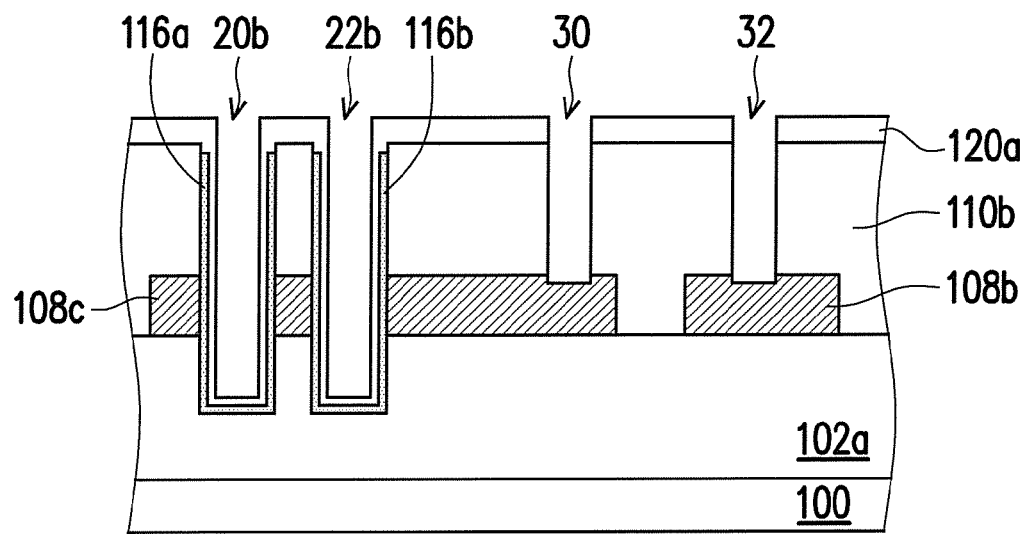
Figure 2I:
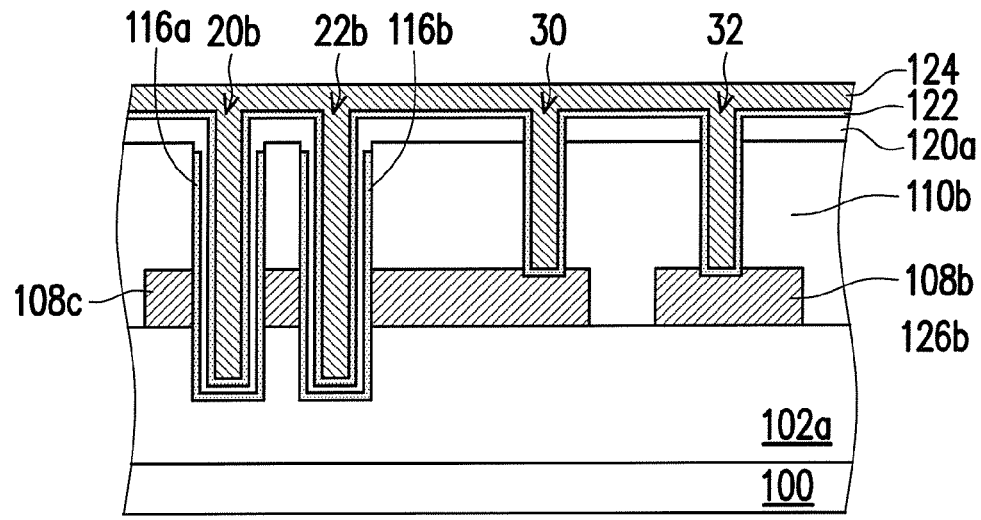

Referring to FIGS. 2H and 2I, the via openings 30 and 32 are formed in a dielectric layer 110b at the side of the openings 20b and 22b. Then, the top electrode material layer 122 is formed on the dielectric layer 110b. More specifically, the top electrode material layer 122 covers a surface of the capacitor dielectric material layer 120a, and is conformally formed in the openings 20b and 22b and the via openings 30 and 32. Then, the conductive material layer 124 is formed on the dielectric layer 110b. The conductive material layer 124 is filled into the openings 20b and 22b, so as to respectively form the plugs 124a and 124b. The conductive material layer 124 is filled into the via openings 30 and 32, so as to respectively form the vias 132 and 134 (as shown in FIG. 2J).

Figure 2J:
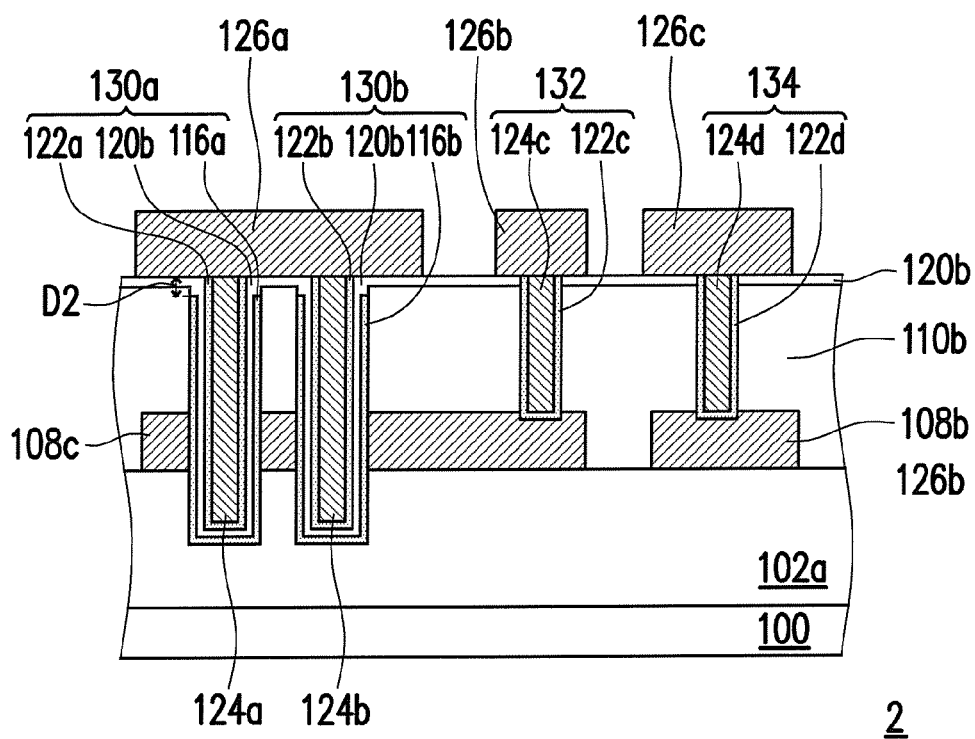

Referring to FIGS. 2I and 2J, a planarization process is performed to remove the conductive material layer 124, the top electrode material layer 122, and a portion of the capacitor dielectric material layer 120a on the top surface of the dielectric layer 110b, so as to expose a surface of a capacitor dielectric layer 120b. Then, the conductive layers 126a, 126b, and 126c are formed on the capacitor dielectric layer 120b. The conductive layer 126a is electrically connected to the cup-shaped capacitors 130a and 130b. The conductive layer 126b is electrically connected to the via 132. The conductive layer 126c is electrically connected to the via 134.

Referring to FIGS. 1J and 2J together, a capacitor structure 2 according to the second embodiment of the invention is generally similar to the capacitor structure 1 according to the first embodiment of the invention, except the difference that the capacitor dielectric layer 120b of the capacitor structure 2 further extends to the top surface of the dielectric layer 110b. The capacitor dielectric layer 120b is not only disposed between the top electrode 122a and the bottom electrode 116a, but also between the conductive layers 126a, 126b, and 126c and the dielectric layer 110b. Since the capacitor dielectric layer 120b is disposed between the conductive layer 126a and the dielectric layer 110b, the top surface of the capacitor dielectric layer 120b and the top surface of the top electrode 122a are substantially coplanar. Accordingly, a distance D2 (i.e., the height of the portion of the sidewalls S and the thickness of the capacitor dielectric layer 120b) is kept between the top surface of the bottom electrode 116a and the top surface of the top electrode 122a. In an embodiment, the distance D2 may be in a range from 0.012 μm to 2002 μm. Besides, the capacitor structure 2 according to the second embodiment of the invention may not include the blocking layer 104. However, the invention is not limited thereto.

In view of the foregoing, in the invention, a metal-insulator-metal (MIM) capacitor is manufactured by using an inter-metal process in the original semiconductor manufacturing processes. Therefore, an additional MIM manufacturing process is not required. Specifically, in the MIM capacitor, the capacitor dielectric layer is formed between two metal layers, and the top electrode and the bottom electrode are formed by performing a via process. Accordingly, the invention is applicable to the conventional semiconductor structure and does not require additional manufacturing process and cost. Besides, in the invention, the MIM capacitor may be formed between two or more inter-metal layers. Therefore, a chip area may be effectively used and a capacitance area may also be increased to enhance a capacitance density.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A capacitor structure, comprising:
   a dielectric layer, located on a substrate;
   a first conductive layer, located in the dielectric layer; and
   a cup-shaped capacitor, penetrating through the first conductive layer and located in the dielectric layer, wherein the cup-shaped capacitor comprises:
   a bottom electrode, wherein two sidewalls of the bottom electrode are electrically connected to the first conductive layer;
   a capacitor dielectric layer, covering a surface of the bottom electrode;
   a top electrode, covering a surface of the capacitor dielectric layer, wherein the capacitor dielectric layer is disposed between the top electrode and the bottom electrode, and a top surface of the bottom electrode is lower than a top surface of the top electrode; and
   a plurality of vias disposed in the dielectric layer at a side of the cup-shaped capacitor, wherein one of the vias is electrically connected to the bottom electrode through the first conductive layer.

2. The capacitor structure as claimed in claim 1, wherein a distance is kept between the top surface of the bottom electrode and the top surface of the top electrode, and the distance is in a range from 0.01 μm to 2000 μm.

3. The capacitor structure as claimed in claim 1, further comprising:
   a second conductive layer, disposed on the cup-shaped capacitor, wherein the second conductive layer is electrically connected to the top electrode.

4. The capacitor structure as claimed in claim 3, further comprising a plug disposed between the top electrode and the second conductive layer, wherein the top electrode surrounds the plug, and the plug is electrically connected to the second conductive layer.

5. The capacitor structure as claimed in claim 3, wherein the capacitor dielectric layer further extends to a top surface of the dielectric layer, and the capacitor dielectric layer is disposed between the second conductive layer and the dielectric layer.

6. The capacitor structure as claimed in claim 1, further comprising a blocking layer disposed below the cup-shaped capacitor.

7. The capacitor structure as claimed in claim 1, wherein materials of the bottom electrode and the top electrode comprise titanium nitride, tantalum nitride, tungsten, titanium tungsten, aluminum, copper, or a combination thereof.

8. The capacitor structure as claimed in claim 1, wherein a material of the capacitor dielectric layer comprises low-temperature oxide, nitride, or a combination thereof.

9. A method of manufacturing a capacitor structure, comprising:
   forming a dielectric layer on a substrate;
   forming a first conductive layer in the dielectric layer;
   forming a cup-shaped capacitor in the dielectric layer, wherein the cup-shaped capacitor penetrates through the first conductive layer, and the cup-shaped capacitor comprises:
   a bottom electrode, wherein two sidewalls of the bottom electrode are electrically connected to the first conductive layer;
   a capacitor dielectric layer, covering a surface of the bottom electrode; and
   a top electrode, covering a surface of the capacitor dielectric layer, wherein the capacitor dielectric layer is disposed between the top electrode and the bottom electrode, and a top surface of the bottom electrode is lower than a top surface of the top electrode; and forming a plurality of vias in the dielectric layer at a side of the cup-shaped capacitor, wherein one of the vias is electrically connected to the bottom electrode through the first conductive layer.

10. The method of manufacturing the capacitor structure as claimed in claim 9, after forming the cup-shaped capacitor in the dielectric layer, further comprising forming a second conductive layer on the cup-shaped capacitor, wherein the second conductive layer is electrically connected to the top electrode.

11. The method of manufacturing the capacitor structure as claimed in claim 9, wherein the step of forming the cup-shaped capacitor in the dielectric layer comprises:

forming a first opening in the dielectric layer, wherein the first opening penetrates through the first conductive layer;

forming a bottom electrode material layer in the first opening;

forming a photoresist layer on the dielectric layer, wherein the photoresist layer is filled into the first opening and covers a surface of the bottom electrode material layer;

removing a portion of the photoresist layer and a portion of the bottom electrode material layer, so as to expose a portion of a sidewall of the first opening, and forming the bottom electrode in the first opening;

removing the photoresist layer;

forming a capacitor dielectric material layer on the dielectric layer, wherein the capacitor dielectric material layer at least covers the surface of the bottom electrode and a portion of the sidewall of the first opening;

forming a top electrode material layer on the dielectric layer, wherein the top electrode material layer covers a surface of the capacitor dielectric material layer; and performing a planarization process to remove the top electrode material layer on a top surface of the dielectric layer.

12. The method of manufacturing the capacitor structure as claimed in claim 11, wherein the step of forming the vias in the dielectric layer at the side of the cup-shaped capacitor comprises: after forming the capacitor dielectric material layer on the dielectric layer, forming a plurality of via openings in the dielectric layer at the side of the cup-shaped capacitor.

13. The method of manufacturing the capacitor structure as claimed in claim 12, in the step of forming the top electrode material layer on the dielectric layer, wherein the top electrode material layer further extends to cover surfaces of the via openings.

14. The method of manufacturing the capacitor structure as claimed in claim 13, after forming the cup-shaped capacitor in the dielectric layer, the method further comprises:

forming a conductive material layer on the dielectric layer, wherein the conductive material layer is filled into the first opening to form a plug, the conductive material layer is filled into the via openings.

15. The method of manufacturing the capacitor structure as claimed in claim 14, wherein a material of the conductive material layer comprises titanium nitride, tantalum nitride, tungsten, titanium tungsten, aluminum, copper, or a combination thereof.

16. The method of manufacturing the capacitor structure as claimed in claim 11, wherein the step of forming the first opening in the dielectric layer comprises:

forming a patterned mask layer on the dielectric layer;

using the first conductive layer as an etch stop layer, performing a first etching process to remove a portion of the dielectric layer; and performing a second etching process to remove a portion of the first conductive layer, so as to penetrate through the first conductive layer.

17. The method of manufacturing the capacitor structure as claimed in claim 11, before forming the first conductive layer in the dielectric layer, the method further comprising forming a blocking layer below the cup-shaped capacitor.

18. The method of manufacturing the capacitor structure as claimed in claim 17, wherein the step of forming the first opening in the dielectric layer comprises:

forming a patterned mask layer on the dielectric layer; and using the blocking layer as an etch stop layer, performing a third etching process to remove a portion of the dielectric layer, wherein the first conductive layer has at least one second opening, and the second opening corresponds to the first opening.

19. The method of manufacturing the capacitor structure as claimed in claim 11, wherein the planarization process comprises a chemical mechanical polishing process.

* * * * *